United States Patent
Ota et al.

(10) Patent No.: US 7,420,607 B2
(45) Date of Patent: Sep. 2, 2008

(54) SOLID-STATE IMAGING ELEMENT AND DIGITAL CAMERA

(75) Inventors: Motoari Ota, Asaka (JP); Naoki Kubo, Asaka (JP)

(73) Assignee: Fujifilm Corporation, Tokyo (JP)

( * ) Notice: Subject to any disclaimer, the term of this patent is extended or adjusted under 35 U.S.C. 154(b) by 762 days.

(21) Appl. No.: 10/755,356

(22) Filed: Jan. 13, 2004

(65) Prior Publication Data

US 2004/0201760 A1 Oct. 14, 2004

(30) Foreign Application Priority Data

Jan. 14, 2003 (JP) ............ P. 2003-006095

(51) Int. Cl.
*H04N 3/14* (2006.01)
*H04N 5/335* (2006.01)

(52) U.S. Cl. ............ 348/315; 348/275; 348/280; 348/282; 348/322

(58) Field of Classification Search ............ 348/315, 348/372, 222.1, 294, 311, 312, 275, 229.1, 348/296, 367, 272–274, 276–277, 208.99; 257/222, 225, 229

See application file for complete search history.

(56) References Cited

U.S. PATENT DOCUMENTS

| | | | | |
|---|---|---|---|---|
| 5,703,641 A | * | 12/1997 | Watanabe | ............ 348/274 |
| 6,236,434 B1 | * | 5/2001 | Yamada | ............ 348/315 |
| 6,831,692 B1 | * | 12/2004 | Oda | ............ 348/315 |
| 6,961,157 B2 | * | 11/2005 | Tandon et al. | ............ 358/512 |
| 7,190,403 B2 | * | 3/2007 | Yamashita et al. | ............ 348/364 |
| 2002/0190254 A1 | * | 12/2002 | Turner et al. | ............ 257/59 |

FOREIGN PATENT DOCUMENTS

| JP | 2001-008104 A | 1/2001 |
|---|---|---|
| JP | 2001-094999 A | 4/2001 |

* cited by examiner

*Primary Examiner*—Ngoc-Yen T. Vu
*Assistant Examiner*—David Holt
(74) *Attorney, Agent, or Firm*—Birch, Stewart, Kolasch & Birch, LLP

(57) ABSTRACT

A solid-state imaging element contains a plurality of photoelectric converting regions, vertical transfer portions, a horizontal transfer portion, and an output portion. These photoelectric converting regions are arranged on a surface of a semiconductor substrate along a row direction, and a column direction perpendicular to the row direction. The photoelectric converting regions are subdivided into main regions "m" having relatively wide light-receiving areas, and sub-regions "s" having relatively narrow light-receiving areas. These main areas "m" and sub-areas "s" produce signal electron charges corresponding to light having predetermined spectral sensitivities, and then store the produced signal electron charges. A partial photoelectric converting region within the photoelectric converting regions corresponds to different color light with respect to the main region "m" and the sub-region "s."

11 Claims, 3 Drawing Sheets

SOLID-STATE IMAGING ELEMENT AND DIGITAL CAMERA

This Non-provisional application claims priority under 35 U.S.C. § 119(a) on Patent Application No(s). 2003-006095 filed in Japan on Jan. 14, 2003, the entire contents of which are hereby incorporated by reference.

BACKGROUND OF THE INVENTION

1. Field of the Invention

The present invention relates to a solid-state imaging element containing a plurality of photoelectric converting regions which are arranged on a surface of a semiconductor substrate along a row direction and a column direction perpendicular to this row direction, and also related to a digital camera using the solid-state imaging element.

2. Description of the Related Art

In solid-state imaging elements used in digital still cameras, electron charges which correspond to image signals are detected by photoelectric converting elements such as photodiodes. As a result, generally speaking, it is practically difficult to widen dynamic ranges of these solid-state imaging elements. To solve this difficulty, such a process operation has been employed so as to acquire wide dynamic ranges. In this process operation, while both a high-sensitivity photographing operation and a low-sensitivity photographing operation are continuously carried out within a short time, two sheets of acquired image signals are synthesized with each other (refer to, for instance, Japanese Laid-open Patent Application No. 2001-94999). However, since these two image signals to be synthesized with each other do not correspond to such two image signals which have been acquired at the same time, there is a problem that unnatural images may be produced as to a motional photographic subject.

As another solving means, the use of such a solid-state imaging element has been proposed (refer to, for example, Japanese Laid-open Patent Application No. 2001-8104). This solid-state imaging element owns a photoelectric converting element having a relatively high sensitivity and another photoelectric converting element having a relatively low sensitivity. However, since the photoelectric converting elements which are arranged at spatially-separated positions are used as the high-sensitivity pixel and the low-sensitivity pixel, there is another problem that resolution is relatively lowered.

On the other hand, in order to acquire color image information, image signals having at least three color spectral sensitivities are required. When color image information is acquired by employing a solid-state imaging element, each of photoelectric converting elements corresponds to any one of at least three color spectral sensitivities. As a consequence, in such a case that color image information is acquired by using a single solid-state imaging element, image signals having respective spectral sensitivities are acquired from two-dimensionally different places, so that Nyquist domains (spatial frequency distributions) are not made coincident with each other. As a result, certain photographic subjects may conduct such a phenomenon as so-called "artificial color" and "color moiré." There is a further problem that image qualities of photographed images are deteriorated.

SUMMARY OF THE INVENTION

The present invention has been made to solve the above-described problems, and therefore, has an object to provide a solid-state imaging element capable of acquiring an image signal having high resolution and a wide dynamic range, while suppressing occurrences of so-termed "artificial color" and "color moiré."

A solid-state imaging element, according to the present invention, is featured by such a solid-state imaging element comprising a plurality of photoelectric converting regions which are arranged on a surface of a semiconductor substrate along a row direction and a column direction perpendicular to the row direction, in which each of the photoelectric converting regions contains a main region having a relatively wide light-receiving area and a sub-region having a relatively narrow light-receiving area; and a partial photoelectric converting region within the plurality of photoelectric converting regions outputs photoelectric converting signals having different spectral sensitivities with respect to the main region and the sub-region.

A solid-state imaging element, according to the present invention, is featured by such a solid-state imaging element comprising a plurality of photoelectric converting regions which are arranged on a surface of a semiconductor substrate along a row direction and a column direction perpendicular to the row direction, in which each of the photoelectric converting regions contains a main region having a relatively wide light-receiving area and a sub-region having a relatively narrow light-receiving area; and the photoelectric converting regions includes: a first sort of photoelectric converting region in which both the main region and the sub-region output photoelectric converting signals having a first spectral sensitivity; a second sort of photoelectric converting region in which the main region outputs a photoelectric converting signal having a second spectral sensitivity and the sub-region outputs a photoelectric converting signal having a third spectral sensitivity; and a third sort of photoelectric converting region in which the main region outputs a photoelectric converting signal having a third spectral sensitivity and the sub-region outputs a photoelectric converting signal having a second spectral sensitivity.

A solid-state imaging element, according to the present invention, is featured by such a solid-state imaging element comprising a plurality of photoelectric converting regions which are arranged on a surface of a semiconductor substrate along a row direction and a column direction perpendicular to the row direction, in which each of the photoelectric converting regions contains a main region having a relatively wide light-receiving area and a sub-region having a relatively narrow light-receiving area; and the photoelectric converting regions includes: a first sort of photoelectric converting region in which both the main region and the sub-region store thereinto signal electron charges having a first spectral sensitivity; a second sort of photoelectric converting region in which the main region stores thereinto signal electron charges having a second spectral sensitivity and the sub-region stores thereinto signal electron charges having a third spectral sensitivity; and a third sort of photoelectric converting region in which the main region stores thereinto signal electron charges having a third spectral sensitivity and the sub-region stores therein signal electron charges having a second spectral sensitivity; a vertical transfer portion for independently transferring the signal electron charges from the photoelectric converting regions to the main region and the sub-region along the column direction; a horizontal transfer portion transferring the signal electron charges from the vertical transfer portion along the row direction; and an output portion for outputting a signal corresponding to the signal electron charges transferred by the horizontal transfer portion.

The first sort of the photoelectric converting region employed in the solid-state imaging element of the present invention is arranged in a rectangular lattice shape along both the row direction and the column direction perpendicular to the row direction; both the second sort of photoelectric converting region and the third sort of photoelectric converting region are arranged in a staggering shape and are arranged as an entire region in a rectangular lattice shape along the row direction and the column direction perpendicular to the row direction; and the first sort of photoelectric converting region, the second sort of photoelectric converting region, and the third sort of photoelectric converting region are arranged in the same arranging pitch at such positions which are positionally shifted by a ½ of the arranging pitch along the row direction and the column direction.

The first spectral sensitivity to the third spectral sensitivity defined in the solid-state imaging element of the present invention are any of spectral sensitivities as to a red color, a blue color, and a green color.

The first spectral sensitivity defined in the solid-state imaging element of the present invention corresponds to a spectral sensitivity of a green color.

The spectral sensitivity defined in the solid-state imaging element of the present invention is determined by a color filter positioned above the main region and the sub-region.

A digital camera according to the present invention is featured by mounting thereon the above-explained solid-state imaging element.

DESCRIPTION OF THE PREFERRED EMBODIMENTS

Figure 3:
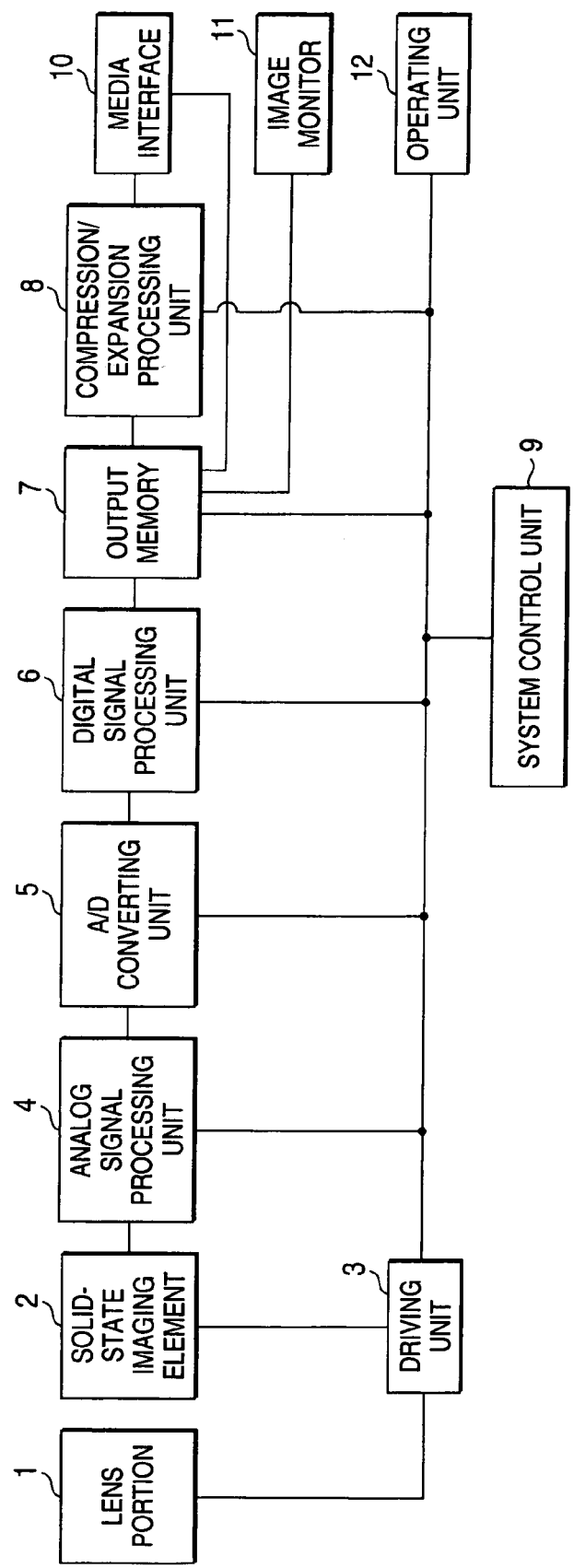
FIG. 3 is a diagram for schematically representing an arrangement of a digital camera according to the embodiment of the present invention.

Referring now to drawings, an embodiment of the present invention will be described. FIG. 3 is a schematic structural diagram for showing a digital camera according to an embodiment of the present invention. The digital camera of FIG. 3 is arranged by containing an imaging unit, a signal processing unit, an output unit, an operating unit 12, and a system control unit 9. The imaging unit includes a lens unit 1, a solid-state imaging element 2, a driving unit 3. The signal processing unit includes an analog signal processing unit 4, an A/D converting unit 5, a digital signal processing unit 6, and an output memory 7, and a compression/expansion processing unit 8. The output unit includes a media interface 10, and an image monitor 11. The operating unit 12 contains a mode selecting switch, a release button, and the like. The system control unit 9 controls an entire system of the digital camera.

In the imaging unit, light which has passed through the lens unit is focused onto a focal point on the solid-state imaging element 2, and then a photographed image signal is acquired. While the photographed image signal is acquired, both the lens unit 1 and a diaphragm (not shown) are controlled via the driving unit 3. In response to an ON-operation of a release switch (not shown) by manipulating the release button (not shown), the solid-state imaging element 2 is driven by the driving unit 3 containing a timing generator at predetermined timing so as to output the photographed image signal. The solid-state imaging element 2 owns a plurality of photoelectric converting regions which are arranged on a surface of a semiconductor substrate along both a row direction and a column direction located perpendicular to the row direction. While each of the photoelectric converting regions contains both a main region having a relatively wide light-receiving area, and a sub-region having a relatively narrow light-receiving area, a partial photoelectric converting region within a plurality of photoelectric converting regions is used to output such photoelectric converting signals having spectral sensitivities (spectral responsivities) which are different from each other with respect to the main region thereof and the sub-region thereof.

The photographed image signal is processed by the analog signal processing unit 4, and thereafter, this processed analog image signal is converted into a digital image signal by the A/D converting unit 5, and then, this digital image signal is sent to the digital signal processing unit 6. This digital signal processing unit 6 executes a digital signal processing operation in response to an operation mode set by the operating unit 12, and thus, the resulting image data is temporarily stored in the output memory 7.

The digital signal processing operation executed by the digital signal processing unit 6 involves a white balance adjustment, a gamma-correcting process operation, an image synthesizing process operation, a simultaneous process operation, a Y/C process operation, and the like. In the case that an image obtained based upon the image data processed by the digital image processing operation is displayed on an image monitor 11 (through-image display), the image data of the output memory 7 is read and the read image data is sent to the image monitor 11. After this image data of the output memory 7 is compress-processed by the compression/expansion processing unit 8, the compressed image data is recorded on a recording medium such as a memory card (not shown) via a media interface 10. An image produced based upon the image data recorded on the recording medium may also be displayed on the image monitor 11.

The system control unit 9 controls an entire system of the digital camera, which containing a photographing operation. The system control unit 9 is mainly constructed of a processor which is operated in accordance with a predetermined program. This processor is equipped with a memory and a work memory, while this memory stores thereinto a program and various sorts of data required to operate this processor.

The operation unit 12 is used to manipulate various sorts of operations when the digital camera is used. This operating unit 12 turns ON/OFF a photographing method during photographing operation, a photographing condition, and a photograph review function, and also, sets a recording mode with respect to a recording medium. In the operating unit 12, operating members corresponding to the respective functions may be employed. Alternatively, operating members may be commonly used in conjunction with displays of the image monitor 11.

Figure 1:
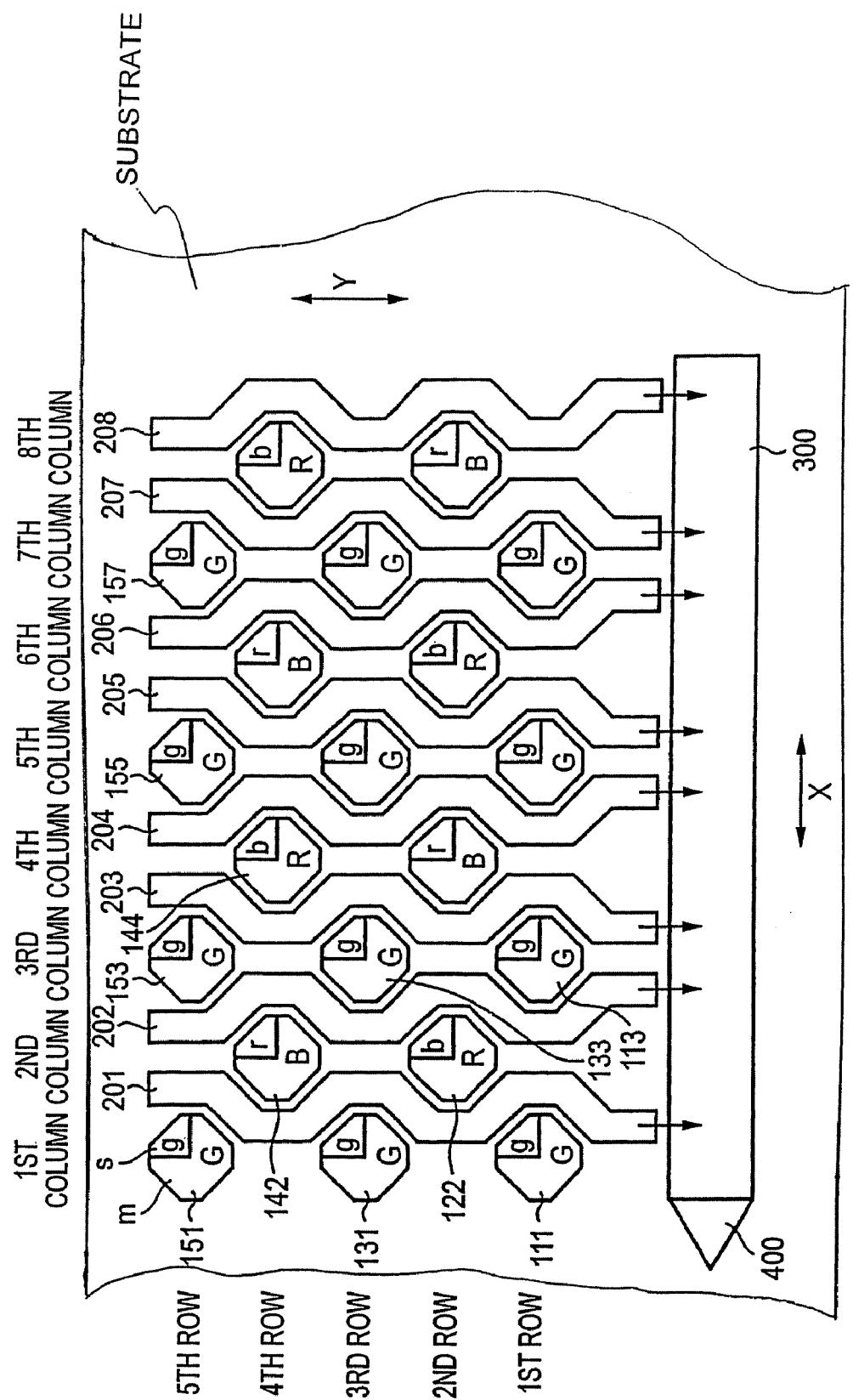
FIG. 1 is a diagram for schematically showing a structure of a solid-state imaging element according to an embodiment of the present invention.

FIG. 1 is a diagram for schematically indicating a structure of the solid-state imaging element according to the embodiment of the present invention. FIG. 1 is a partially-enlarged plan view of the solid-state imaging element having a so-called "honeycomb" structure. This solid-state imaging element contains a plurality of photoelectric converting regions 111 to 157 (only partial photoelectric converting regions are numbered in this drawing), vertical transfer portions 201 to 208, a horizontal transfer portion 300, and an output portion 400. These plural photoelectric converting regions 111 to 157 are arranged on the surface of the semiconductor substrate along a row direction (namely, direction indicated by arrow "X") and a column direction (direction indicated by arrow "Y") perpendicular to this row direction. The photoelectric converting regions located in odd-numbered columns within a plurality of photoelectric converting regions 111 to 157 are arranged in such a manner that these regions are positionally shifted along the column direction by approximately ½ of a column-direction pitch among the photoelectric converting regions with respect to the photoelectric converting regions arranged in even-numbered columns. Also, the photoelectric converting regions located in odd-numbered rows within a plurality of photoelectric converting regions 111 to 157 are arranged in such a manner that these regions are positionally shifted along the row direction by approximately ½ of a row-direction pitch among the photoelectric converting regions with respect to the photoelectric converting regions arranged in odd-numbered rows. It should also be noted that although the structure of FIG. 1 represents such photoelectric converting regions constructed of 5 rows×8 columns, large numbers of photoelectric converting regions are actually provided.

The photoelectric converting regions 111 to 157 produce signal electron charges in correspondence with an incident light amount, and store thereinto the signal electron charges, and correspond to, for instance, photodiodes. Each of these photoelectric converting regions 111 to 157 is subdivided into both a main region "m" having a relatively wide light-receiving area and a sub-region "s" having a relatively narrow light-receiving area (in FIG. 1, symbols "m" and "s" are attached only to photoelectric converting region 151). The respective main region "m" and sub-region "s" produce signal electron charges corresponding to predetermined spectral sensitivities, and store thereinto these produced signal electron charges. In the solid-state imaging element of FIG. 1, a red (indicated by either "R" or "r") filter, a green (denoted by either "G" or "g") filter, or a blue (represented by either "B" or "b") filter is provided above the respective photoelectric converting regions 111 to 151. These photoelectric converting regions 111 to 157 produce signal electron charges corresponding to the respective color light, and store there into these produced signal electron charges. It should also be understood that symbols "RGB" indicate filters of the main regions "m", whereas symbols "rgb" represent filters of the sub-regions "s." Since a main region "m" owns a relatively wide light-receiving area with respect to that of a sub-region "s", this main region "m" produces signal electron charges at a relatively high sensitivity with respect to an incident light amount, and then stores thereinto the produced signal electron charges.

Partial photoelectric converting regions contained in the photoelectric converting regions 111 to 157 correspond to plural sets of color light which are different from each other with respect to the main region "m" and the sub-region "s." In FIG. 1, such photoelectric converting regions that main regions thereof correspond to red light and sub-regions thereof correspond to blue light (for example, photoelectric converting region 122), and such photoelectric converting regions that main regions thereof correspond to blue light and sub-regions thereof correspond to red light (for instance, photoelectric converting region 142) are alternately arranged in the even-numbered rows. Photoelectric converting regions are arranged in the odd-numbered rows, both main regions and sub-regions of which correspond to green light (for example, photoelectric converting region 111). The photoelectric converting regions along the column direction are arranged as follows: Such photoelectric converting regions that main regions thereof correspond to red light and sub-regions thereof correspond to blue light, and such photoelectric converting regions that main regions thereof correspond to blue light and sub-regions thereof correspond to red light are alternately arranged in the even-number columns. Photoelectric converting regions are arranged in the odd-numbered columns, both main regions and sub-regions of which correspond to green light. While a detailed operation will be explained later, signal electron charges of the main regions "m" and signal electron charges of the sub-regions "s" are independently read to the vertical transfer portions 201 to 208 so as to be transferred.

The vertical transfer portions 201 to 208 read the signal electron charges from the photoelectric converting regions 111 to 157, and then transfer these read signal electron charges along the column direction. These vertical transfer portions 201 to 208 are provided on the side portions thereof in correspondence to the respective columns of the photoelectric converting regions 111 to 157. The horizontal transfer portion 300 transfers such signal electron charges along the row direction, which have been transferred from a plurality of vertical transfer portions 201 to 208. The output portion 400 outputs a voltage signal in response to an amount of transferred signal electron chares.

Figure 2:
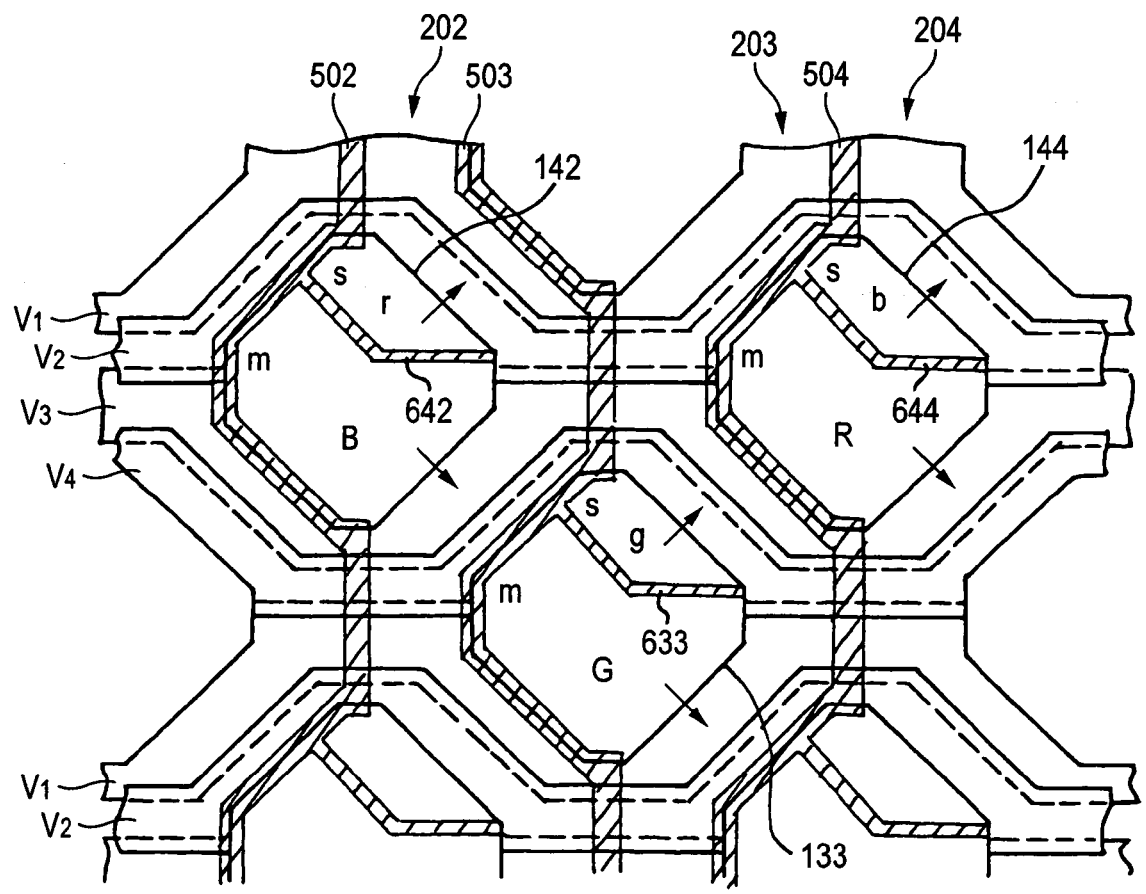
FIG. 2 is a diagram for representing a further detailed construction located around photoelectric converting regions of the solid-state imaging element shown in FIG. 1.

FIG. 2 is a diagram for representing a further detailed structure located around the photoelectric converting regions 142, 144, and 133 of the solid-state imaging element 2 shown in FIG. 1. The vertical transfer portions 202, 203, 204 are arranged by containing element isolating regions 502, 503, 504; a vertical transfer channel (not shown), and also, vertical transfer electrodes V1 to V4. The element isolating regions 502, 503, 504 are formed on the semiconductor substrate. The vertical transfer channel is sectioned by the photoelectric converting regions 142, 144, 133. The vertical transfer electrodes V1 to V4 are formed by this information. Since voltages applied to the vertical transfer electrodes V1 to V4 are controlled, signal electron charges are readout from photoelectric converting regions, and the read signal electron charges can be transferred. Arrows shown in FIG. 2 indicate directions along which the signal electron charges are read from the photoelectric converting regions 142, 144, 133 to the electron charges transferring portions 202, 203, 204.

While the photoelectric converting regions 142, 144, 133 are subdivided by the element isolating regions 642, 644, and 633, both the main regions "m" having the relatively wide light-receiving areas and the sub-regions "s" having the relatively narrow light-receiving areas are formed in these photoelectric converting regions 142, 144, and 133. As a consequence, both the main regions "m" and the sub-regions "s" produce such signal electron charges in response to light corresponding to filters which are arranged above these main regions "m" and sub-regions "s", and then store thereinto these produced signal electron charges.

Next, driving operations of the solid-state imaging element 2 shown in FIG. 1 and FIG. 2 will now be explained. In response to intensity of incident light from a photographic field, signal electron charges corresponding to the respective color filters are stored into both the main areas "m" and the sub-areas "s" of the photoelectric converting regions 111 to 157. Subsequently, since read pulses are applied to both the vertical transfer electrodes V1 and V3, the signal electron charges of the main regions "m" are read out to the vertical transfer portions 201 to 208, and are furthermore transferred to the output portion 400 by the horizontal transfer portion 300. Then, a voltage signal corresponding to the transferred signal electron charges is outputted. When the output of the signal electron charges from the main regions "m" is accomplished, read pulses are applied to the vertical transfer electrodes V2 and V4, so that the signal electron charges of the sub-regions "s" are read to the vertical transfer portions 201 to 208, and then are transferred in a similar manner. Thus, a voltage signal corresponding to these transferred signal electron charges is outputted from the output portion 400.

As previously explained, since the plural color signals are outputted from the same photoelectric converting regions, in such a case that the synchronous process operation is carried out based upon the image signals outputted from the solid-state imaging element 2, since a large number of color signals of the photoelectric converting regions can be utilized, the occurrence of the artificial color can be suppressed. Also, as to the green color, since both the high-sensitivity image signal and the low-sensitivity image signal can be obtained, the image signal having the wide dynamic range can be produced. Furthermore, since the color image signal can be produced only by the image signals derived from the two photoelectric converting regions, such a color image signal in which the occurrence of the artificial color has been reduced can be produced in a high speed.

The solid-state imaging element 2 shown in FIG. 1 and FIG. 2 corresponds to such a solid-state imaging element having a so-called "honeycomb" structure. Alternatively, the present invention may be applied to another solid-state imaging element, the photoelectric converting regions of which are arranged in a rectangular lattice shape. Also, in the embodiment, the CCD type solid-state imaging element has been described in which signal electron charges produced in photoelectric converting regions are transferred by utilizing electron charge transferring portions. Alternatively, the present invention may be similarly applied to an MOS type solid-state imaging element in which signal electron charges are directly converted into voltage signals and from which these voltage signals are derived.

Also, as the photoelectric converting regions, there are provided: the first sort of photoelectric converting region in which both the main region thereof and the sub-region thereof store thereinto the signal electron charges of the first spectral sensitivity; the second sort of photoelectric converting region in which the main region thereof stores thereinto the signal electron charges of the second spectral sensitivity and the sub-region thereof stores thereinto the signal electron charges of the third spectral sensitivity; and the third sort of photoelectric converting region in which the main region thereof stores thereinto the signal electron charges of the third spectral sensitivity and the sub-region thereof stores thereinto the signal electron charges of the second spectral sensitivity. Alternatively, the spectral sensitivities of the photoelectric converting regions may be arbitrarily set. Any types of photoelectric converting regions may be employed if partial photoelectric converting regions may output the photoelectric converting signals having the different spectral sensitivities from the main region and the sub-region. In addition, as the first spectral sensitivity, the green color has been exemplified. Alternatively, this color may be arbitrarily selected.

As apparent from the above-described explanations, in accordance with the present invention, such a solid-state imaging element capable of acquiring the image signal having the high resolution and also the wide dynamic range can be provided, while the occurrences of the artificial color and of the color moiré are suppressed.

What is claimed is:

1. A solid-state imaging element comprising:
    a plurality of photoelectric converting regions which are arranged on a surface of a semiconductor substrate along a row direction and a column direction perpendicular to the row direction, wherein:
    each of said photoelectric converting regions contains a main region having a relatively wide light-receiving area and a sub-region having a relatively narrow light-receiving area; and
    the photoelectric converting regions includes:
    a first sort of photoelectric converting region in which both the main region and the sub-region output photoelectric converting signals having a first spectral sensitivity;
    a second sort of photoelectric converting region in which the main region outputs a photoelectric converting signal having a second spectral sensitivity and the sub-region outputs a photoelectric converting signal having a third spectral sensitivity; and
    a third sort of photoelectric converting region in which the main region outputs a photoelectric converting signal having the third spectral sensitivity and the sub-region outputs a photoelectric converting signal having the second spectral sensitivity.

2. The solid-state imaging element according to claim 1, wherein in each photoelectric converting region, the main region and the sub region are divided by element isolation region in plan view.

3. The solid-state imaging element according to claim 1, further comprising:
    color filters provided above the main regions and the sub regions, respectively, wherein:
    in the second sort of photoelectric converting region, a color of the color filter provided above the main region is different from that of the color filter provided above the sub region,
    the color of the color filter provided above the main region of the second sort of photoelectric converting region is identical with a color of the color filter provided above the sub region of the third sort of photoelectric converting region, and
    the color of the color filter provided above the sub region of the second sort of photoelectric converting region is identical with a color of the color filter provided above the main region of the third sort of photoelectric converting region.

4. A solid-state imaging element comprising:
    a plurality of photoelectric converting regions which are arranged on a surface of a semiconductor substrate along a row direction and a column direction perpendicular to the row direction, wherein:
    each of said photoelectric converting regions contains a main region having a relatively wide light-receiving area and a sub-region having a relatively narrow light-receiving area; and
    the photoelectric converting regions includes
    a first sort of photoelectric converting region in which both the main region and the sub-region store therein signal electron charges having a first spectral sensitivity,
    a second sort of photoelectric converting region in which the main region stores therein signal electron charges having a second spectral sensitivity and the sub-region stores therein signal electron charges having a third spectral sensitivity, and
    a third sort of photoelectric converting region in which the main region stores therein signal electron charges having the third spectral sensitivity and the sub-region stores therein signal electron charges having the second spectral sensitivity, the solid-state imaging element further comprising:

a vertical transfer portion for independently transferring the signal electron charges from the main region and the sub-region along the column direction;

a horizontal transfer portion transferring the signal electron charges from the vertical transfer portion along the row direction; and an output portion for outputting a signal corresponding to the signal electron charges transferred by said horizontal transfer portion.

5. The solid-state imaging element according to claim 4, wherein in each photoelectric converting region, the main region and the sub region are divided by element isolation region in plan view.

6. The solid-state imaging element according to claim 4, further comprising:

color filters provided above the main regions and the sub regions, respectively, wherein:

in the second sort of photoelectric converting region, a color of the color filter provided above the main region is different from that of the color filter provided above the sub region, the color of the color filter provided above the main region of the second sort of photoelectric converting region is identical with a color of the color filter provided above the sub region of the third sort of photoelectric converting region, and the color of the color filter provided above the sub region of the second sort of photoelectric converting region is identical with a color of the color filter provided above the main region of the third sort of photoelectric converting region.

7. The solid-state imaging element as claimed in claim 1, or claim 4 wherein:

the first sort of photoelectric converting region is arranged in a rectangular lattice shape along both the row direction and the column direction perpendicular to the row direction;

both the second sort of photoelectric converting region and the third sort of photoelectric converting region are arranged in a staggering shape and are arranged as an entire region in a rectangular lattice shape along the row direction and the column direction perpendicular to the row direction; and the first sort of photoelectric converting region, the second sort of photoelectric converting region, and the third sort of photoelectric converting region are arranged in the same arranging pitch at such positions which are positionally shifted by a ½ of the arranging pitch along the row direction and the column direction.

8. The solid-state imaging element as claimed in claim 1 or claim 3, wherein:

the first spectral sensitivity to the third spectral sensitivity are any of spectral sensitivities of a red color, a blue color, and a green color.

9. The solid-state imaging element as claimed in claim 8 wherein: the first spectral sensitivity corresponds to a spectral sensitivity of a green color.

10. The solid-state imaging element as claimed in any one of claims 1 to 4, wherein:

the spectral sensitivity is determined by a color filter positioned above said main region and said sub-region.

11. A digital camera wherein:

the digital camera mounts thereon the solid-state imaging element recited in any one of claims 1 to 4.

* * * * *